(12) United States Patent
Chung et al.

(10) Patent No.: US 6,395,645 B1
(45) Date of Patent: *May 28, 2002

(54) ANISOTROPIC WET ETCHING

(75) Inventors: Chen-Kuei Chung; Chien-Chih Lee; Ching-Yi Wu, all of Hsinchu (TW)

(73) Assignee: Industrial Technology Research Institute, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,446

(22) Filed: Aug. 6, 1998

(51) Int. Cl.[7] ............... H01L 21/302; H01L 21/461; B44C 1/22
(52) U.S. Cl. ............ 438/745; 438/753; 216/41
(58) Field of Search ................ 438/745, 753; 216/41

(56) References Cited

U.S. PATENT DOCUMENTS

| 3,735,483 A | * 5/1973 | Sheldon ............ 438/113 |
| 3,765,969 A | * 10/1973 | Kragness et al. ...... 438/753 |
| 4,542,397 A | * 9/1985 | Biegelsen et al. ...... 357/32 |
| 4,600,934 A | * 7/1986 | Aine et al. ........... 428/450 |
| 5,817,174 A | * 10/1998 | Tomita et al. ........ 117/97 |

FOREIGN PATENT DOCUMENTS

JP        4325500 A   * 11/1992

OTHER PUBLICATIONS

Terada et al., Method for Controlling Structure of Crystalline Surface. English Abstract of JP 4325500A, Nov. 13, 1992.*

* cited by examiner

*Primary Examiner*—Benjamin L. Utech
*Assistant Examiner*—Lynette T. Umez-Eronini
(74) *Attorney, Agent, or Firm*—Bacon & Thomas, PLLC

(57) ABSTRACT

A method for anisotropic wet etching is disclosed. In to this invention, a photo mask for the etching mask suited in the anisotropic wet etching is provided. In the photo mask, a pattern with a series of adjacent corners having a substantially rectangular, angle is formed. At the corner areas compensational patterns comprising masked grids are prepared. The pattern on the photo mask is then transferred to an etching mask of a semiconductor substrate such that a multi-level terrace structure with fine corners may be prepared during the etching of the substrate. The method of this invention is also applicable to semiconductor materials with the same diamond structure as that of silicon.

1 Claim, 4 Drawing Sheets

ANISOTROPIC WET ETCHING

FIELD OF THE INVENTION

The present invention relates to a method for anisotropic wet etching, especially to a method for anisotropic wet etching with corner compensation effects and the etching mask for use in the wet etching. The method of the present invention is especially suited in the preparation of multi-level structure of silicon semiconductor.

BACKGROUND OF THE INVENTION

In the applications of semiconductor materials, such as silicon materials, it is always necessary to have a two-level or a multi-level structure with corners particularly of a rectangular angle. Among the methods for the preparation of such cornered multi-level structure, the anisotropic wet etching is frequently used, due to its relatively low cost and its being suited for mass production.

In order to prepare a semiconductor material such as Si(100) using the anisotropic wet etching, an etching mask is first prepared on the surface of the substrate. A pattern is formed in the etching mask using conventional lithography and etching technologies. Materials suited for the etching mask include any etching resistant material which is resistant to etchant(s) used in the etching process for a substantial period of time. The assembly so prepared is then put in an etchant. If the semiconductor substrate is a Si (100) substrate, the etchant is generally a solution of KOH and water. Since the pattern of the etching mask includes masked areas and maskless areas (or intervals), some areas on the surface of the semiconductor substrate are covered while others are exposed to the etchant.

While the substrate is put in-the etchant, the exposed areas on the surface of the semiconductor substrate will first be etched. As time passes, depth and width of the etched areas of the substrate increase, such that areas beneath the masked areas of the etching mask will also be etched off. If time permits, a planar surface will be generated under the masked and maskless areas of the etching mask.

In the conventional art, a two-level structure has been prepared by wet etching process, using an etching mask wherein step depth may be decided by the dimensions of the widths of the masked areas and the intervals, and the etching time. Furthermore, if the etching mask is divided into some zones and the widths of the masked areas and the intervals vary from zone to zone, depths of the etched areas will vary from zone to zone. A multi-level or terrace structure may thus be prepared. U.S. patent application Ser. No. 08/999, 089 disclosed a method for the preparation of a diffraction lens. In this invention, a multistep terrace structure is prepared using a single photo mask by controlling widths of masked areas and intervals of the photo mask and factors during the etching process, such as temperature and concentration of etchant, etching time, misalignment angle etc.

When a multi-level structure is prepared, it is particularly necessary to produce corners of a rectangular, angle in the pattern or the topography. While the anisotropic wet etching approach is used, the etching rate at the corner areas is higher than that at the non-corner areas. This character brings failures in producing corners in the pattern or the topography. Particularly when a series of adjacent corners at different levels shall be produced, the integrity of the corners, will be damaged by the high etching rates at the corner areas of semiconductor substrate.

FIG. 1(a) illustrates an etching mask for the preparation of a series of adjacent corners, as used in the conventional anisotropic wet etching technology. FIG. 1(b) shows a photograph of a terrace structure prepared with the etching mask of FIG. 1(a). As shown in FIG. 1(b), the structure of the corner areas is severely damaged due to the high etching rate at these areas.

In order to solve this problem, the conventional art used the "corner compensation" technology to moderate the etching rate at the corner areas. In other words, compensational patterns are prepared at the corner areas of the etching mask such that etching of the substrate at the corner areas may be moderated. In the conventional art, the compensational patterns included: beams, triangles, squares, bands, split beams, combination of squares and beams and combination of bands and beams. Reference may be made to H. L. Offereins et al.: "Compensating Corner Under-Cutting of (100) Silicon in KOH", Sensor and Materials, 3, 3 (1992), pp. 127–144.

Although the above-said conventional compensation technology is helpful to produce patterns with corners of nearly right angle, some problems are found. These include that additional space are required in preparing the compensational patterns, which brings wastes in photo masks and etching masks, that such compensation is not applicable to patterns with small scales and that it is not suited for terrace structures of more than two levels.

It is thus a need to have a novel method for anisotropic wet etching that is suited to prepare a multi-level structure with integrated adjacent corners.

It is also a need to have an etching mask for anisotropic wet etching wherein no additional space is required for the corner compensation patterns.

It is also necessary to have a method for anisotropic wet etching, which is suited to prepare terrace structures with small scales.

OBJECTIVES OF THE INVENTION

The objective of this invention is to provide a novel method for anisotropic wet etching that is suited to prepare a multi-level structure with integrated adjacent corners.

Another objective of this invention is to provide an etching mask for anisotropic wet etching wherein no additional space is required for the corner compensation patterns.

Another objective of this invention is to provide a method for anisotropic wet etching, which is suited to prepare terrace structures with small scales.

Another objective of this invention is to provide a multi-level structure for a semiconductor material with integrated adjacent corners.

SUMMARY OF THE INVENTION

According to this invention, a photo mask for the etching mask of multi-level structure suited in the anisotropic wet etching is disclosed. In the photo mask, a pattern with a series of adjacent corners having a substantially rectangular, angle is formed. At the corner areas compensational patterns comprising buffer grids are prepared. The pattern on the photo mask is then transferred to an etching mask of a semiconductor substrate such that terrace structure with integrated corners may be prepared during the anisotropic wet etching of the substrate. The method of this invention is also applicable to semiconductor materials with the same diamond structure as that of silicon.

The above and other objectives and advantages of this invention may be clearly understood from the detailed description by referring to the following drawings.

IN THE DRAWINGS

DETAILED DESCRIPTION OF THE INVENTION

According to the present invention, a photo mask for the preparation of etching masks that will be used in anisotropic wet etching is disclosed. In the photo mask, a pattern including a series of corner areas is formed and such pattern is then transferred to the etching mask of a semiconductor substrate by lithography and etching process. Compensational patterns comprising grids are prepared at corner areas of the pattern of the photo mask. As the etching rate at the corner areas of the semiconductor substrate is regulated by the compensational patterns, integrated corners may be prepared during the wet etching.

Figure 1A:
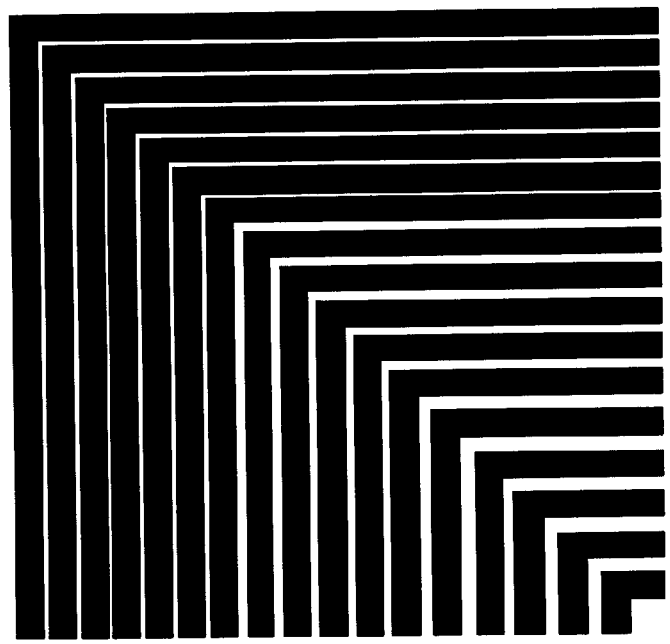
FIG. 1(a) illustrates an etching mask for the preparation of a series of adjacent corners, as used in the conventional anisotropic wet etching technology.
Figure 1B:
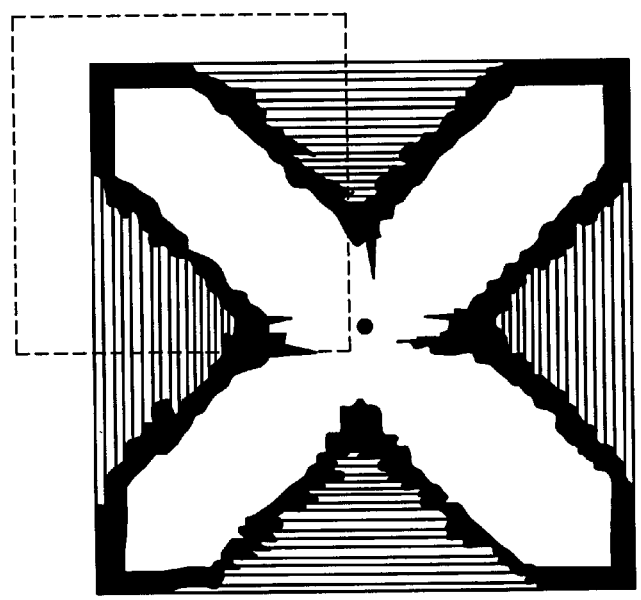
FIG. 1(b) shows a photograph of a terrace structure prepared with the etching mask of FIG. 1(a).
Figure 2B:
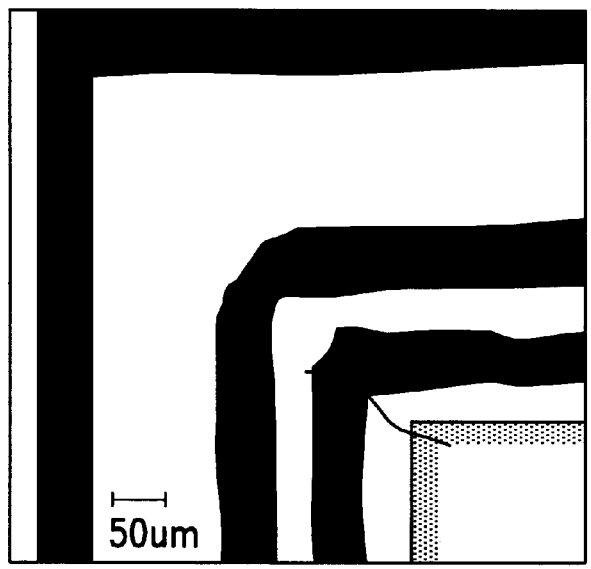
FIG. 2(b) shows a photograph of a terrace structure prepared with the etching mask of FIG. 2(a).
Figure 2A:
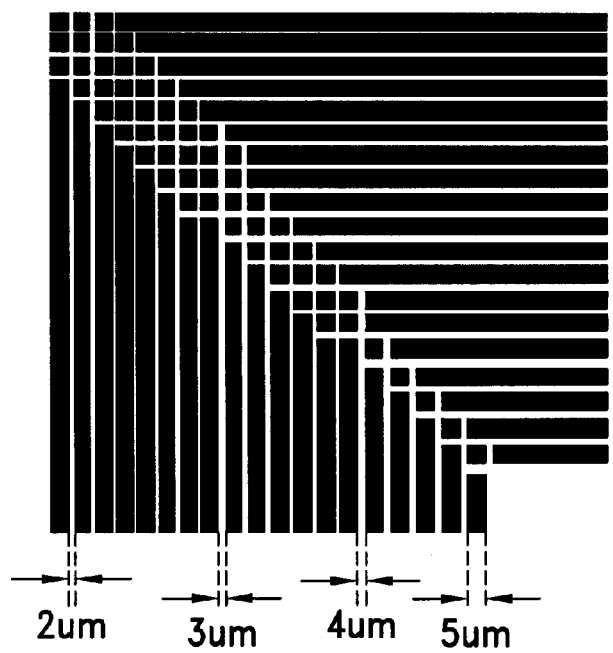
FIG. 2(a) illustrates an etching mask for one embodiment of the method for anisotropic wet etching of this invention.

FIG. 2(a) illustrates an etching mask for one embodiment of the method for anisotropic wet etching of this invention. As shown in this figure, the etching mask of this embodiment comprises a plurality of masked areas and maskless, areas (or intervals), each having different or same width. The etching mask is prepared on the surface of a semiconductor substrate to be etched with anisotropic wet etching. In this embodiment the etching mask has a pattern consisted of straight masked lines and corners at the crossing of the masked lines. Grids are formed at the corner areas of the mask pattern to function as buffers in regulating the etching rate of the etchant to the semiconductor substrate at these corner areas. Width of the masked areas of the mask pattern varies from the outer zone to the inner zones. Due to the variation of the width of the maskless areas, etching rate varies from zone to zone. As such, a multi-level structure may be prepared when the semiconductor substrate is etched in an etchant. A multi-level structure so prepared may be used as a diffraction lens or other microelements.

Figure 3:
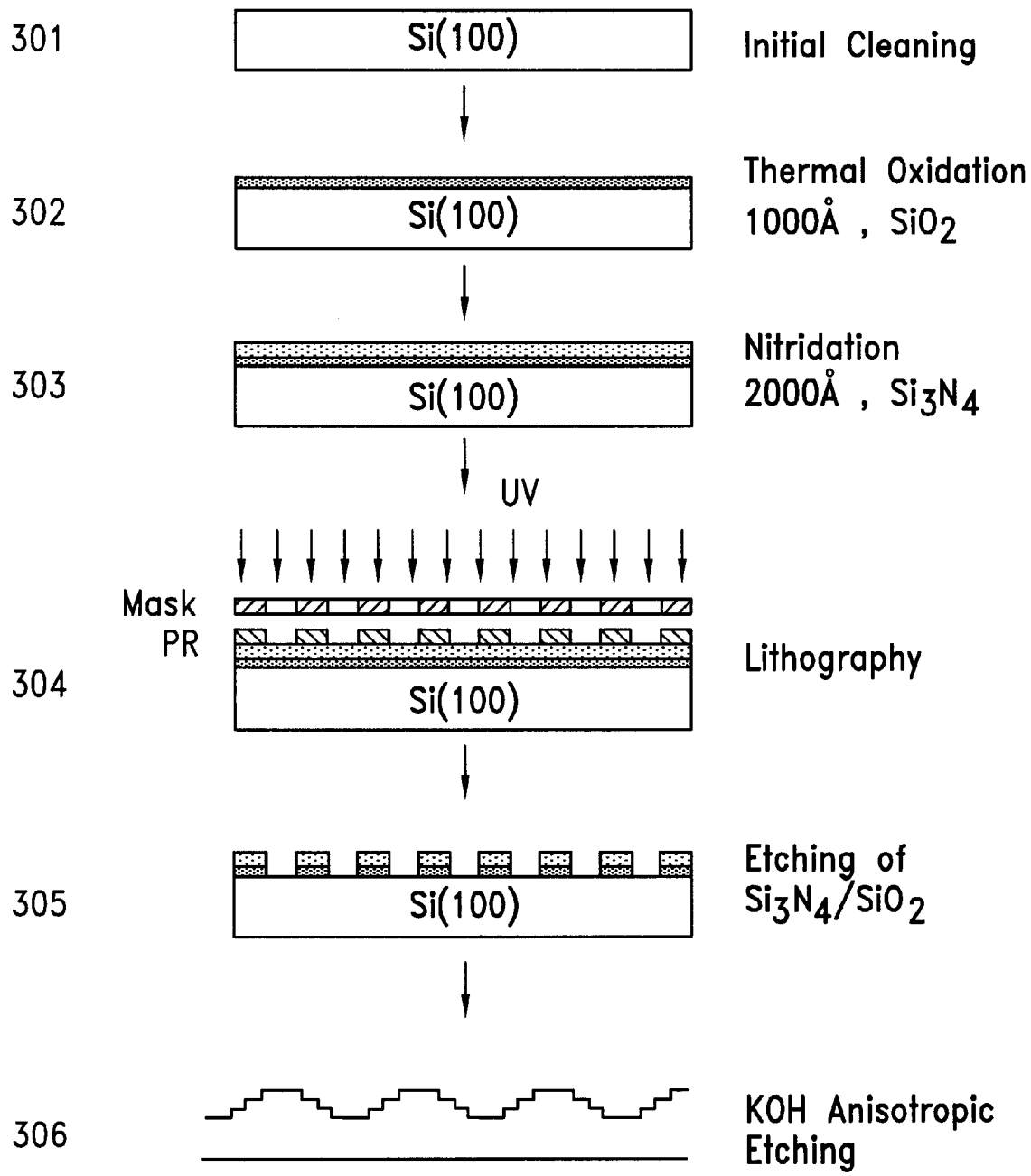
FIG. 3 illustrates the flow chart of one embodiment of the method for anisotropic wet etching of this invention.

The following is a description of one embodiment of the method for anisotropic wet etching of this invention. FIG. 3 illustrates the flow chart of one embodiment of the method for anisotropic wet etching of this invention.

As shown in this figure, in preparing a terrace structure, at 301, a silicon (100) substrate 1 is prepared. Of course, other semiconductor material that is suited in anisotropic wet etching is also applicable in preparing the substrate. If other material is applied, it is preferably that the material has the same diamond structure as that of Si (100).

At 302 a layer of an etching mask material 2 is applied onto the surface of the Si substrate 1. At 303 a pattern is formed in the etching mask 2. The preparation of the mask 2 and its pattern is well know to those skilled in the art and detailed description thereof is thus omitted. FIG. 2(a) shows the pattern of the etching mask so prepared.

In FIG. 2(a), the light areas represent the masked areas of the etching mask and the dark areas represent the maskless areas or intervals of the masked areas. In this embodiment, widths of the masked areas at the outer zone, the middle zone and the inner zone are 2 μm, 3 μm and 4 μm, respectively and the width of the intervals is 5 μm throughout the zones. This etching mask is used to produce a four-level terrace structure after etching the silicon substrate 1. In this four-level structure, depth of the terrace increases from the outer to the inner. At the corner areas the corners are compensated by grids. In other words, the masked areas at the corner areas are consisted of squares defined by masked grids. Although it is not intended to limit the scope of this invention, the grids adjustably decrease the etching rate of the etchant to the semiconductor substrate at the corner areas.

At 304 the substrate-etching mask assembly is put in a 40% KOH etching solution and is etched at 70±2° C. After approximately 2.5 hours, at 305 a four-level terrace structure is prepared.

Figure 4:
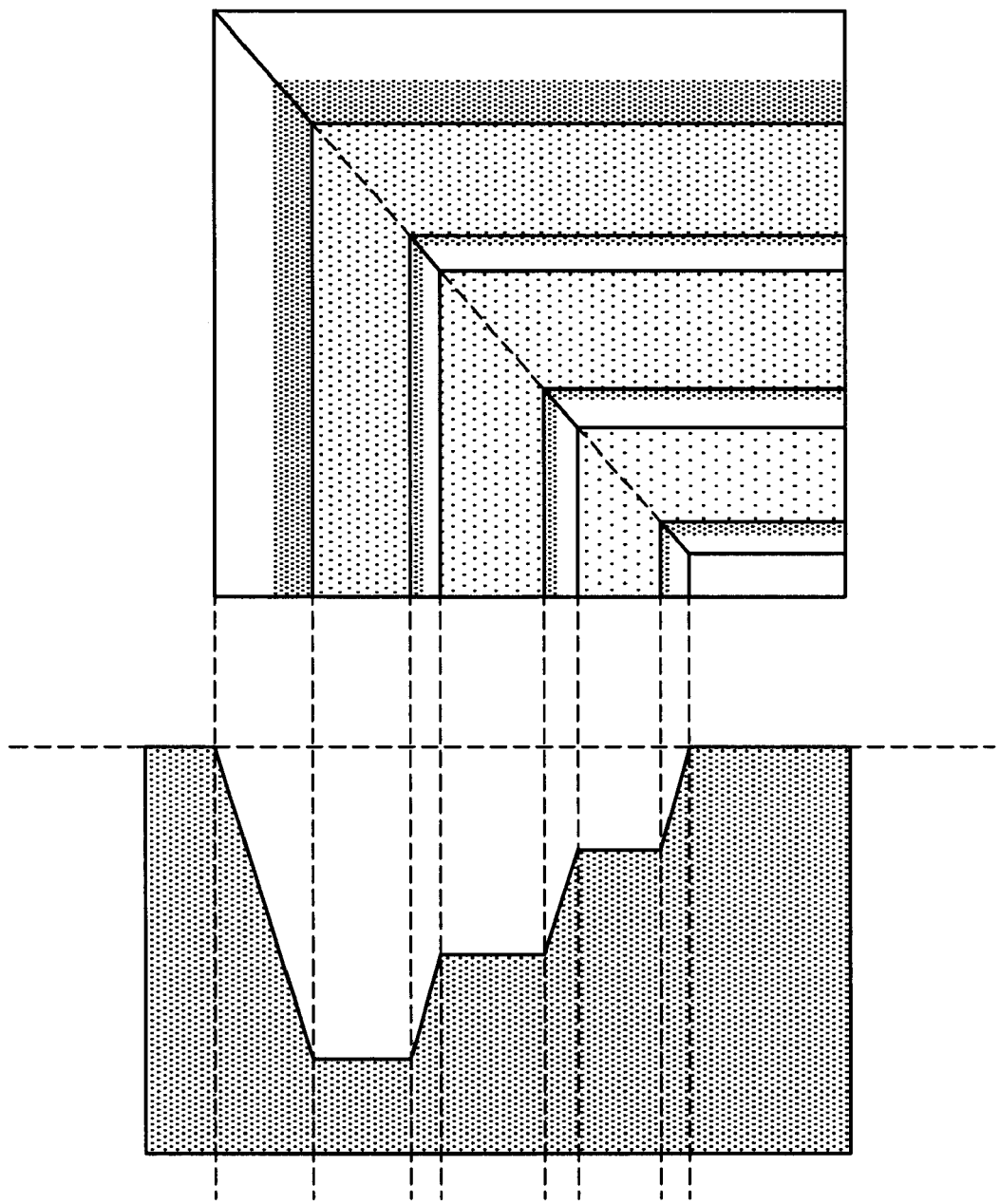
FIG. 4 shows the relation between the top view of a terrace structure and its sectional view.

Observe the product under a microscope. The terrace structure so prepared has fine corners at the corner areas in all the levels. FIG. 2(b) shows a photograph of a four-level terrace structure prepared from the above embodiment. FIG. 4 illustrates the relation between the top view of the terrace structure so prepared and its sectional view. As shown in this figure, the dark areas in FIG. 4 represent areas between two stages of the terrace structure.

In the above embodiment, the misalignment angle to the (110) direction is approximately 1 degree. The etching rate of Si (100) in the KOH solution is relative to the misalignment angle to the (110) direction. It is thus understood that other misalignment angles may be applicable to this invention and may bring similar effects.

EFFECTS OF THE INVENTION

As shown in the above description, the compensational pattern with grids at the corner areas of the photo mask or the etching mask is able to adjustably control the etching rate of the etchant to the semiconductor substrate at the corner areas. Corners with fine structure are thus prepared in the semiconductor substrate during the anisotropic wet etching. The photo mask and the etching mask are useful in preparing multi-level terrace structures with fine corners. No additional space to position the compensational patterns are needed. The invented method is thus useful in preparing multi-level structures with small scales and fine patterns.

In the above embodiment, Si (100) is used as an example of the material for the substrate of the multi-level structure. It is however understood that other semiconductor material with the same diamond structure as that of silicon may also be used as materials of the substrate.

As the present invention has been shown and described with reference to preferred embodiments thereof, those skilled in the art will recognize that the above and other changes may be made therein without departing from the spirit and scope of the invention.

What is claimed is:

1. A method for anisotropic wet etching, comprising the following steps:

preparing a semiconductor substrate;

preparing an etching-resistant layer on said semiconductor substrate;

forming a pattern of intersecting lines to form a series of corners in said etch-resistant layer wherein said pattern comprises a series of masked and maskless areas wherein at least two sets of the masked lines intersect to surround and define a maskless area in a grid pattern at said corners, whereby the etching rate at the corner area of the substrate is moderated and said etching rate is relatively decided by the width of the masked lines;

etching said etch-resistant and semiconductor substrate layers in an etchant, and wherein the widths of the masked areas vary in a sequential manner in which the widths of a masked area in a first zone is 2 $\mu$m, in a second zone is 3 $\mu$m and in a third zone is 4 $\mu$m and the width of intervals is 5 $\mu$m.

* * * * *